United States Patent
Christ

(10) Patent No.: US 7,646,235 B2
(45) Date of Patent: Jan. 12, 2010

(54) PROGRAMMABLE CURRENT GENERATOR, CURRENT GENERATION METHOD AND TRANSMITTER ARRANGEMENT

(75) Inventor: Volker Christ, Neuss (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 11/705,839

(22) Filed: Feb. 13, 2007

(65) Prior Publication Data

US 2008/0191744 A1  Aug. 14, 2008

(51) Int. Cl.
 G05F 1/10  (2006.01)
 G05F 3/02  (2006.01)
(52) U.S. Cl. .................... 327/543; 341/145
(58) Field of Classification Search .............. 327/543, 327/538, 540, 541; 323/315; 341/144, 145
 See application file for complete search history.

(56) References Cited

U.S. PATENT DOCUMENTS

| | | | |
|---|---|---|---|
| 5,541,597 A * | 7/1996 | Chi-Mao ................. 341/144 |
| 6,037,888 A * | 3/2000 | Nairn ..................... 341/145 |
| 7,068,201 B1 * | 6/2006 | Chou ..................... 341/144 |
| 2003/0201924 A1 * | 10/2003 | Lakshmikumar et al. .... 341/153 |
| 2004/0263373 A1 * | 12/2004 | Horsky et al. ............ 341/145 |

* cited by examiner

Primary Examiner—Quan Tra
(74) Attorney, Agent, or Firm—Eschweiler & Associates, LLC

(57) ABSTRACT

A programmable current generator includes a decoder unit to generate a first and a second set of control signals as a function of a current control word. The current generator further includes a first and a second array of current sources, wherein the current sources of the first array generate a first current and an auxiliary current, each depending on the first set of control signals and on a reference current. The second array of current sources generates a second current depending on a second set of control signals and on the auxiliary current. An output current is generated depending on the first and the second current.

29 Claims, 8 Drawing Sheets

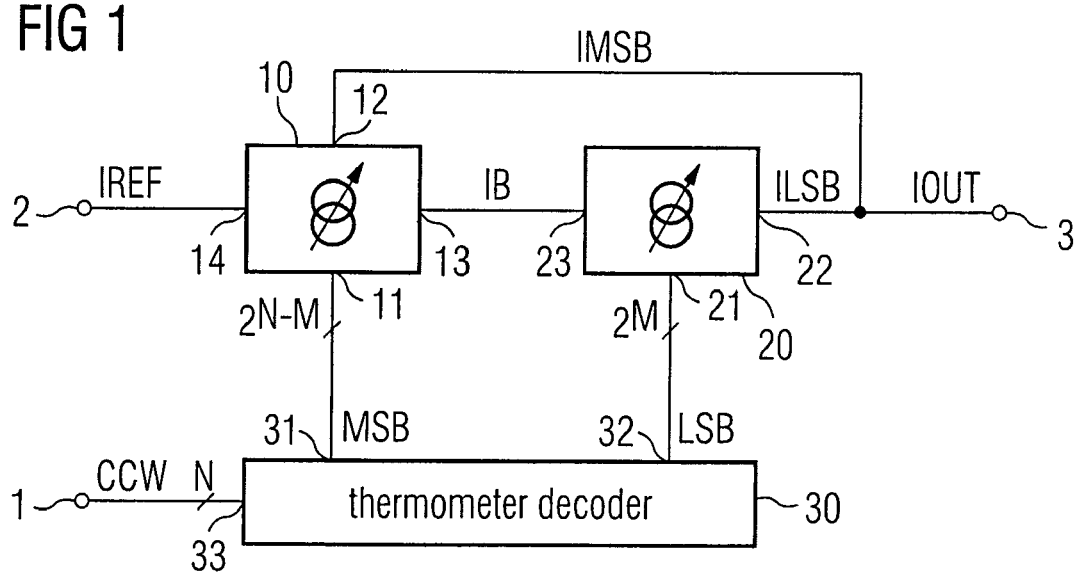
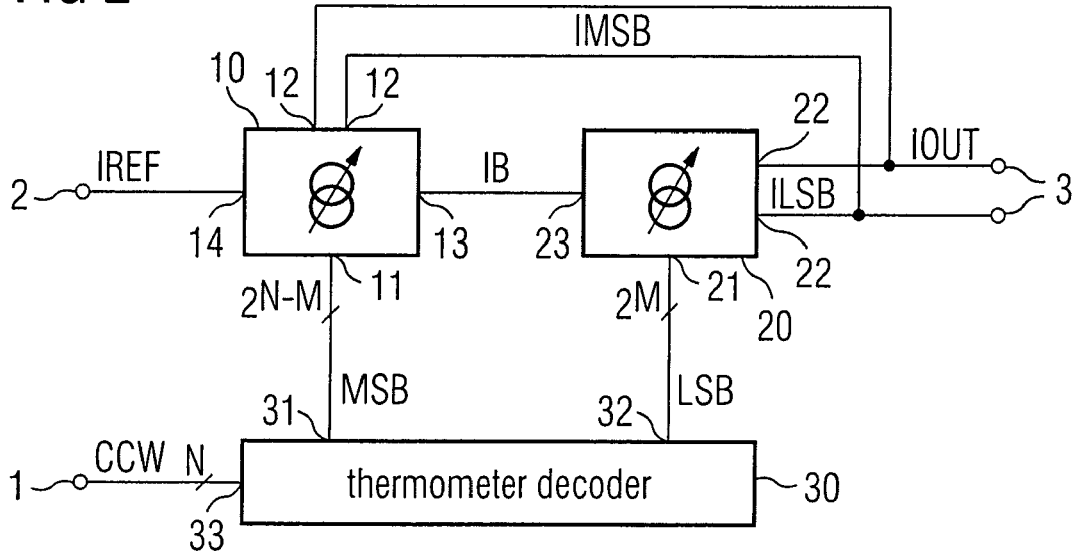

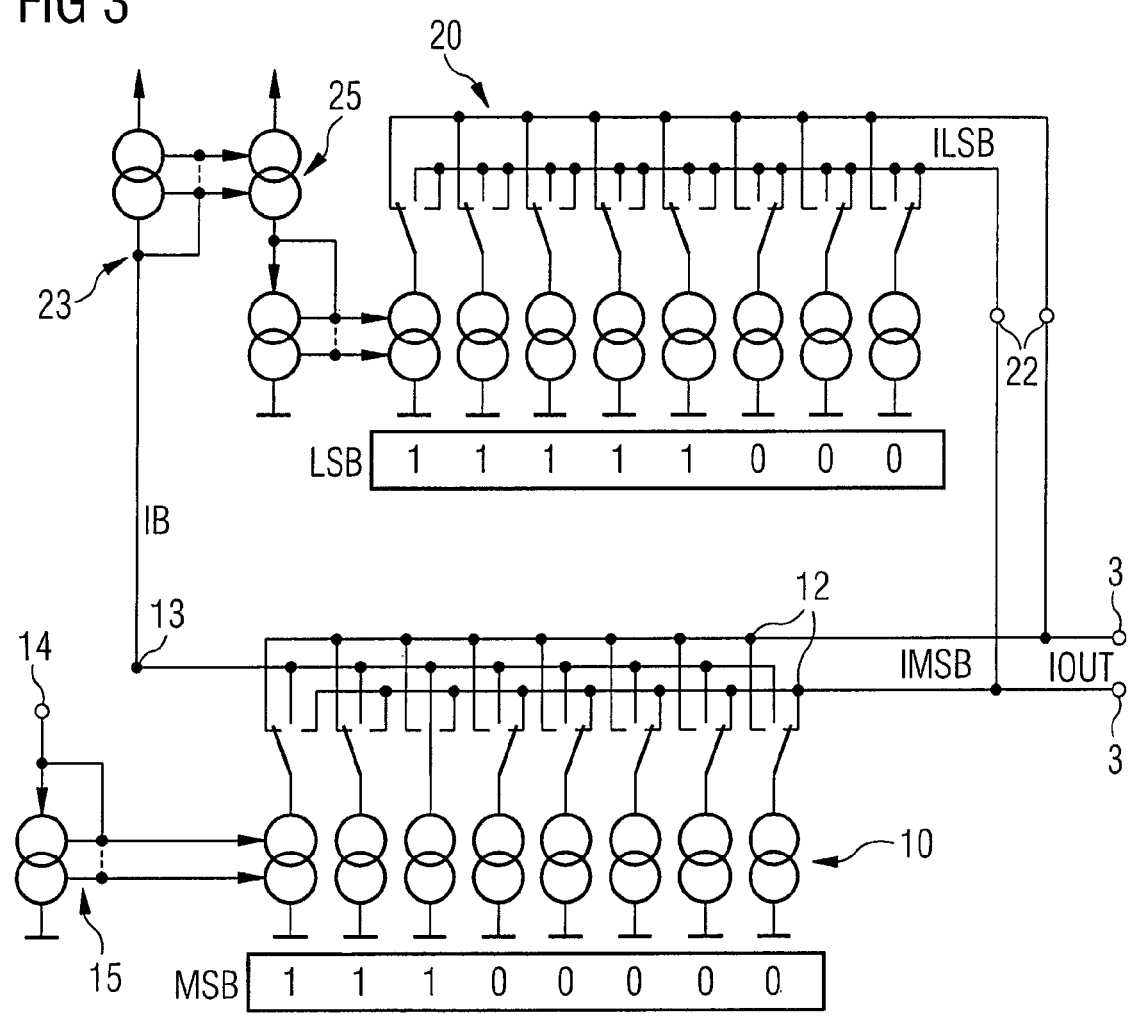

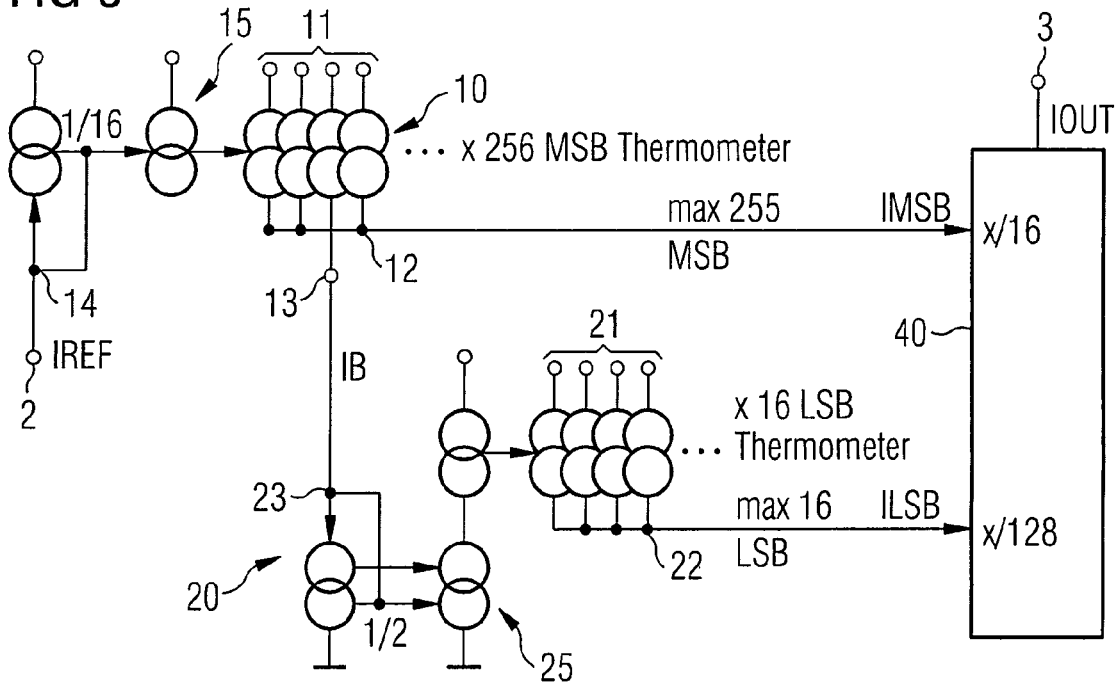
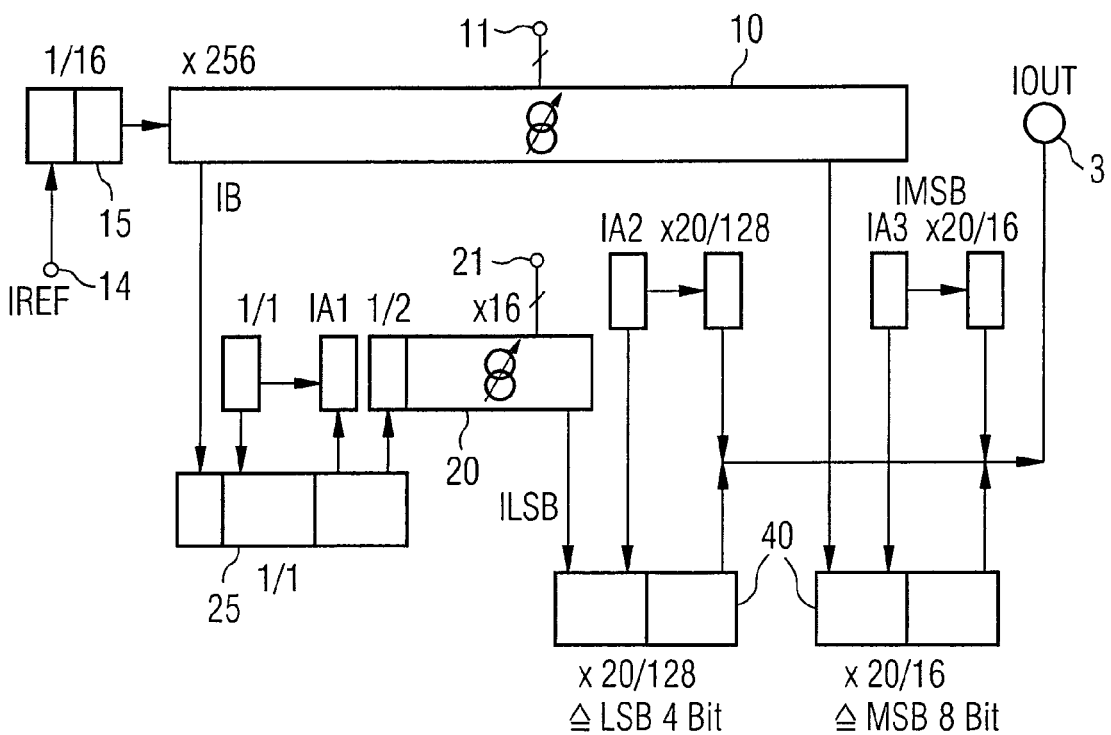

US 7,646,235 B2

PROGRAMMABLE CURRENT GENERATOR, CURRENT GENERATION METHOD AND TRANSMITTER ARRANGEMENT

BACKGROUND OF THE INVENTION

In today's wireless radio systems, different mobile radio standards such as Global System for Mobile Communication (GSM), Enhanced Data Rates For GSM Evolution (EDGE), and Universal Mobile Telecommunications Standard (UMTS) are used. Data transmission in these and other systems is performed using radio frequency signals.

Before sending the radio frequency signals, for example over an antenna in a mobile radio device, the radio frequency signals are usually amplified by a power amplifier. The transmitting power or output power of the power amplifier can depend on a position of the mobile radio device. For example, a higher transmitting power is needed if the mobile radio device is at a further distance from a base station. A higher transmitting power can also be needed if the mobile radio device is transmitting a radio frequency signal comprising data at a higher data rate.

It can be necessary to be able to switch between different values of transmitting power with short switching times to achieve a sufficient power consumption and a good transmitting quality. In many cases, the transmitting power can be adjusted by providing a controlled working current to the power amplifier which, for example, is provided by a digital/analog converter (DAC) with a current output.

The DAC can be a voltage DAC providing an output voltage corresponding to a control word, wherein the output voltage is converted to a current by a voltage-to-current converter. The voltage DAC usually comprises a plurality of converting stages which degrade an accuracy and a noise performance of the DAC.

The DAC can also be realized as a current DAC comprising a plurality of binary weighted current sources, which are controlled by a binary control word, or a plurality of equally weighted current sources which are controlled by a thermometer coded control word. In case of the binary weighted current sources, it can happen that the output current is not monotonic in view of the binary control word; that means an output current can be decreased for an increasing binary control word. In case of the equally weighted current sources, a control logic for generating the thermometer coded control word from a respective binary control word can be space consuming for a higher word length of the control word when realized in an integrated circuit.

BRIEF DESCRIPTION OF THE DRAWINGS

The invention is explained in detail below using exemplary embodiments with reference to the drawings in which FIG. 1 is a first embodiment of a programmable current generator, FIG. 2 is a second embodiment of a programmable current generator, FIG. 3 is an embodiment illustrating arrays of current sources, FIG. 8 is a first schematic overview of a programmable current generator, FIG. 9 is a second schematic overview of a programmable current generator.

DETAILED DESCRIPTION OF THE INVENTION

Figure 4:
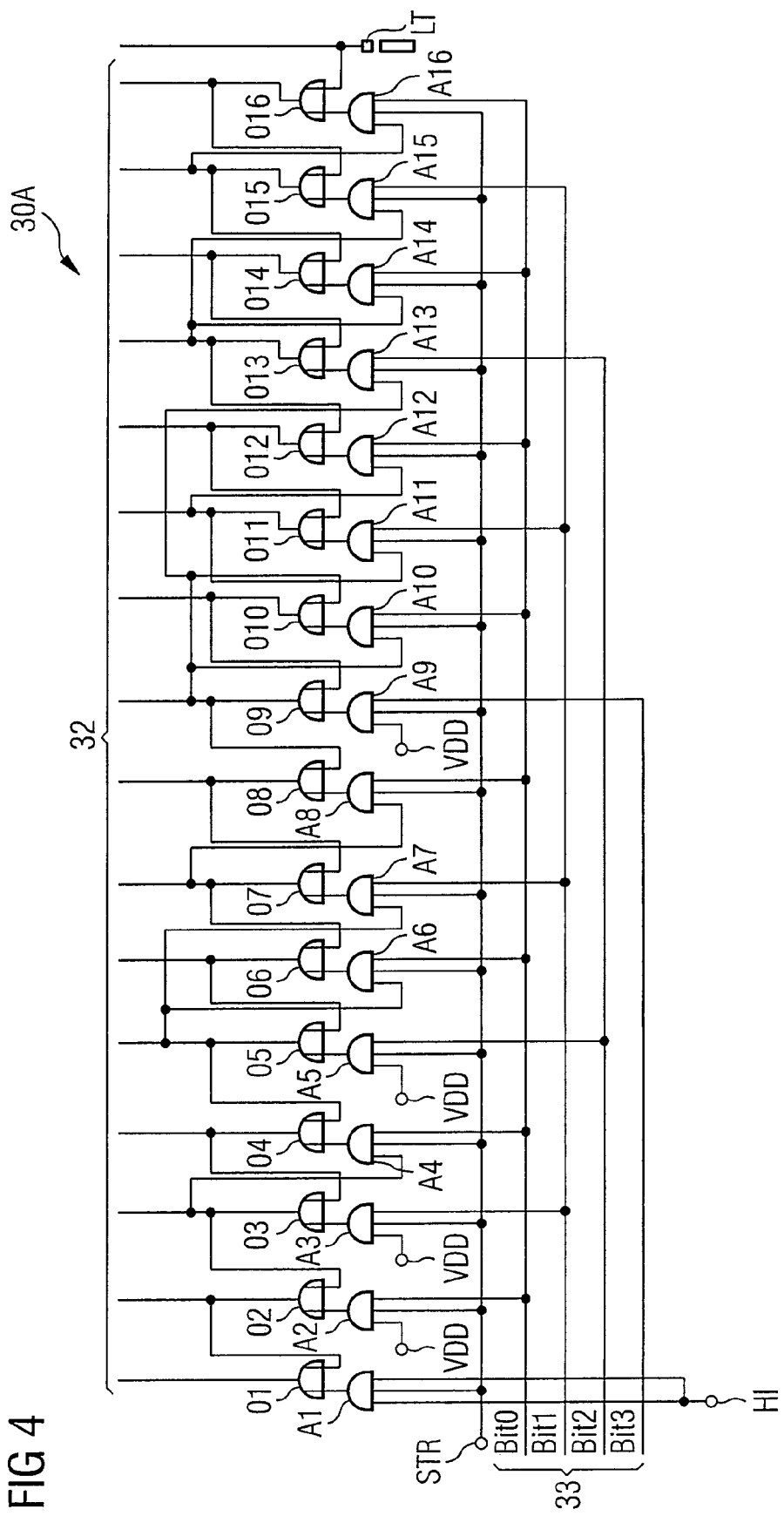
FIG. 4 is a first embodiment of a decoder unit.

In the following description further aspects and embodiments of the present invention are disclosed. In addition, reference is made to the accompanying drawings, which form a part thereof, and in which is shown by way of illustration, in which the invention may be practiced. The embodiments herein provide a better understanding of one or more aspects of the present invention. This disclosure of the invention is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows an embodiment of a programmable current generator which comprises a decoder unit 30 and a first and a second array of current sources 10, 20. The decoder unit 30 comprises an input 33 which is coupled to a control input 1 to receive a current control word CCW with a word length of N bits. The decoder unit 30 further comprises a first set of control outputs 31 to provide a first set MSB of more significant control signals to a set of control inputs 11 of the first array 10 of current sources.

Accordingly, the decoder unit 30 comprises a second set 32 of control outputs to provide a second set LSB of less significant control signals to a set 21 of control inputs of the second array 20 of current sources. In this embodiment, the second set LSB of control signals comprises $2^M$ thermometer coded control signals, wherein M corresponds to a word length of a less significant portion of the current control word CCW. The first set MSB of control signals comprises $2^{N-M}$ thermometer coded control signals, wherein N-M corresponds to a word length of a more significant portion of the current control word CCW.

The first array 10 of current sources comprises a number of current sources which is equal or greater to the number of control signals of the first set MSB of control signals. The first array 10 further comprises a reference current input 14 for receiving a reference current IREF from a reference current tap 2.

In one embodiment, each of the current sources of the first array 10 is able to provide approximately the same current at its respective current output, wherein a current value of each of the current sources depends on the reference current IREF. The first array 10 comprises a first output 12 and an auxiliary output 13. Each of the current sources can be controlled by a respective control signal of the first set MSB of control signals such that a respective current of the current source is provided to the first output 12 or to the auxiliary output 13 or no current is provided.

In a similar way, the second array 20 of current sources comprises a number of current sources corresponding to at least the number of control signals of the second set LSB of control signals. Through the control signals of the second set LSB, it can be controlled whether the current sources provide their respective output currents to a second output 22 or not. The output currents of the current sources of the second array 20 depend on an auxiliary current IB which is provided at an auxiliary input 23 coupled to the auxiliary output 13. Similar to the first array 10, each of the current sources of the second array 20 is able to provide approximately the same current at its respective current output, wherein a current value of each of the current sources depends on the auxiliary current IB.

In this respect, approximately the same current in one embodiment means that the current sources each provide a current having the same nominal value. To have current sources providing exactly the same output current is difficult to achieve in a practical realization, such that a small deviation between the output currents is possible. As all the current sources of the first array 10 of current sources and all the current sources of the second array 20 of current sources comprise the same nominal value for their output currents, the current sources are equally weighted. Alternatively, the current sources of the first array 10 can have different-output currents than the current sources of the second array 20.

The sum of output currents of the current sources of the first array 10 form a first current IMSB corresponding to a more significant portion of the current control word CCW or to the first set MSB of control signals, respectively. Accordingly, the sum of output currents of the current sources of the second array 20 form a second current ILSB corresponding to a less significant portion of the current control word CCW or to the second set LSB of control signals, respectively. A sum of the first current IMSB and the second current ILSB is provided as an output current IOUT at a current output 3.

In one embodiment, a first number of control signals of the first set MSB comprise a first logic level, wherein the first number corresponds to the binary value of the first portion of the current control word CCW. Accordingly, the remaining control signals of the first set MSB comprise a second logic level. In the same way, a second number of control signals of the second set LSB comprise the first logic level, wherein the second number corresponds to a binary value of the second portion of the current control word CCW. The remaining control signals of the second set LSB comprise the second logic level in this embodiment.

In one embodiment, the first portion represents a respective number of more significant bits of the current control word CCW, and a second portion represents a respective number of less significant bits of the current control word CCW.

In one embodiment the control signals are generated such that for an increasing binary value of a respective portion of the current control word CCW, an increasing number of control signals of the respective set of control signals comprises the first logic value, for example a logical 1. Accordingly, the number of respective control signals which comprise a second logic level, for example a logical 0, decreases.

In the first set MSB of control signals, one of the control signals comprising the first logic level can be regarded as being at the cross-over between the control signals comprising the first logic level and the control signals comprising the second logic level. The current source which is controlled by this cross-over control signal in the first array 10 of current sources provides its output current to the auxiliary output 13 for providing the auxiliary current IB. The remaining current sources which are controlled by the control signals comprising the first logic level provide their output currents together as the first current IMSB at the first output 12.

In the second array 20 of current sources, all the current sources controlled by the control signals comprising the first logic level together provide the second current ILSB which depends on the auxiliary current IB provided by the first array 10. For example, in one embodiment the auxiliary current IB is divided in the second array 20 into a number of current portions corresponding to the number of current sources or control signals of the second set LSB of control signals. In this case, for a smallest possible binary value of the second portion of the current control word CCW, only one current portion is provided by one of the current sources of the second array 20 as the second current ILSB. For a highest possible binary value of the second portion of the current control word CCW, for example all of the current sources of the second array 20 provide a current to the second output 22 resulting in a second current ILSB corresponding to the value of the auxiliary current IB. Therefore, the second current ILSB is dependent on the value of the auxiliary current IB provided by one of the current sources of the first array 10.

In another embodiment, for a smallest possible binary value of the second portion of the current control word CCW, no current portion is provided by the second array 20 as the second current ILSB. In other words, there is no offset current provided for the second current ILSB for any binary value. For a highest possible binary value of the second portion of the current control word CCW, for example all except one of the current sources of the second array 20 provide a current to the second output 22 resulting in a second current ILSB corresponding to a value being one current portion smaller than the value of the auxiliary current IB. For example for the smallest possible binary value of the second portion of the current control word CCW, none of the control signals of the second set LSB of control signals comprises the first logic level. Therefore a respective current source could be omitted in this embodiment, further reducing a space needed in an integrated circuit.

In one embodiment, for an increasing binary value of the first portion of the current control word CCW a next current source provides the auxiliary current IB and the former crossover current source provides its output current as a portion of the first current IMSB. Therefore a monotonically increasing output current IOUT can be achieved. A dividing of the auxiliary current IB within the second array 20 of the current sources can, for example, be performed using a current mirror, wherein a respective division ratio corresponds to a current mirror ratio between an input current source and the controlled current sources of the second array 20, respectively. In one embodiment it is desirable that the controlled current sources of the second array 20 each comprise the same current mirror ratio.

Accordingly, in one embodiment the first array 10 of current sources can comprise at least one current mirror to scale the reference current IREF for each of the controlled current sources of the first array 10. Therefore, a range of values for the output current IOUT can be controlled by adjusting the reference current IREF.

FIG. 2 shows another embodiment of a programmable current generator which is similar to the embodiment shown in FIG. 1. In this embodiment, the first array 10 of current sources comprises a differential first output 12 for providing a differential first output current IMSB. Accordingly, the second array 20 of current sources comprises a differential second output 22 for providing a differential second current ILSB. Also the output current IOUT is generated as a differential current comprising a first and a second component.

For example, the auxiliary current IB is provided by a current source of the first array 10 which is controlled by the cross-over control signal comprising the first logic level as mentioned above for the embodiment of FIG. 1. The current sources of the first array 10 which are controlled by the control signals of the first set MSB comprising the first logic level provide their output currents as a first component of the first current IMSB. Accordingly, the current sources of the first array 10 which are controlled by the control signals comprising the second logic level provide their output currents as a second component of the first current IMSB.

Accordingly, in the second array 20 of current sources, the current sources, which are controlled by the control signals of the second set LSB of control signals which comprise the first logic level, provide their output currents as a first portion of the second current ILSB. The current sources which are controlled by the control signals comprising the second logic level provide their output currents as a second portion of the second current ILSB. In this embodiment, the first component of the output current IOUT is generated as a sum of the first component of the first current IMSB and a first component of the second current ILSB. A second component of the output current IOUT is generated as a sum of the second component of the first current IMSB and the second component of the second current ILSB.

Therefore, in various embodiments, it is possible to provide the output current IOUT either as a single-ended output current or as a differential output current.

FIG. 3 shows one embodiment of a first and a second array 10 of current sources. In this embodiment, both the first and the second array 10, 20 each comprise eight controlled current sources which, for example, are formed as cascode current sources.

The first array 10 comprises an additional current source coupled to the reference current input 14 which is used as a current mirror 15 for adjusting the respective output currents of the controlled current sources. The current sources are provided with a first set MSB of control signals, wherein in this embodiment a respective logic level of the control signals is denoted by ones and zeros. The first set MSB in this example corresponds to a binary value of 3 of a 3 bit more significant portion of the current control word CCW. In other words, in one embodiment the first set MSB of control signals is a thermometer coded representation of a binary value of 3, resulting in three of the control signals comprising a logical value of 1.

The two left current sources are provided with the control signals comprising a first logic level such that their outputs are switched to a first connection of the first output 12 for providing the first portion of the first current IMSB. The third current source which is controlled by the cross-over control signal comprising the first logic level is controlled such that its output is switched to the auxiliary output 13 for providing the auxiliary current IB. The remaining five current sources on the right side are controlled by the control signals comprising the second logic level such that their outputs are switched to the second connection of the first output 12 for providing the second portion of the first current IMSB.

The second array 20 of current sources comprises a set of current mirrors 25 for scaling or dividing the auxiliary current IB and adjusting the output currents of the respective controlled current sources of the second array 20. The controlled current sources are controlled by the second set LSB of control signals, which in this embodiment is also a thermometer coded representation of a 3 bit less significant portion of the current control word CCW. For example, it comprises five control signals comprising a logical 1 corresponding to a binary value of 5 of the second portion of the current control word CCW. Accordingly, the five left controlled current sources are switched to a first connection of the second output 22 to provide a first component of the second current ILSB. The three controlled current sources on the right side which are controlled by control signals comprising a logical 0 are switched to a second connection of the second output to provide the second portion of the second current ILSB. Respective sums of the first and the second current IMSB, ILSB are provided as the output current IOUT at the differential current output 3. In other words, the current sources of the first and the second array 10, 20 are switchable depending on the first and the second set of control signals MSB, LSB, respectively.

Also in one embodiment it is desirable that the current sources of the first array 10 are each equally weighted and the current sources of the second array 20 are each equally weighted.

FIG. 4 shows an embodiment of a part of a decoder unit 30*a*. The part can, for example, be used to generate the second set LSB of control signals at the second set of control output 32 as a function of a less significant portion of the current control word CCW at a control input 33. In this embodiment, a second portion of the current control word CCW comprises four bits Bit0, Bit1, Bit2, Bit3 corresponding to a binary value, wherein Bit0 is the least significant bit of the second portion and Bit3 is the most significant bit of the second portion. The decoder logic shown in FIG. 4 comprises a number of AND-gates A1 to A16 and a corresponding number of OR-gates O1 to O16. In this embodiment, the decoder logic comprises 16 AND-gates and OR-gates, respectively, corresponding to the word length of 4 bit of the second portion. The AND-gates A1 to A16 and the OR-gates O1 to O16 are coupled such that for an increasing binary value of the second portion, the control signals at the outputs of the OR-gates O1 to O16 comprise a logical 1 for an increasing number of the respective OR-gate, starting from OR-gate O1 and ending at OR-gate O16.

To this end, a center connection of each of the AND-gates A1 to A16 is coupled to a strobe input STR. The OR-gates O1 to O16 are on their input sides coupled to an output of the respective AND-gate A1 to A16 and to the output of the respective neighboring OR-gate. Only for the rightmost OR-gate O16, the second input is coupled to an additional logic tap LT for receiving a logical 0. In other words, an OR-gate is on its input side coupled to an output of a respective AND-gate and to an output of another OR-gate associated with a more significant control signal or to the additional logic tap LT. The output side of the OR-gates O1 to O16 are coupled to the control output 32 for providing the respective control signals. The remaining inputs of the AND-gate A1 are coupled to a connection HI for receiving a signal corresponding to a logical 1, such that independent of the binary value of the second portion, at least one control signal comprises the first logic level which in this case is a logical 1. The rightmost input of the remaining AND-gates A2 to A16 is provided with one of the bits Bit0 to Bit3 of the second portion according to the ordered scheme Bit0, Bit1, Bit0, Bit2, Bit0, Bit1, Bit0, Bit3, Bit0, Bit1, Bit0, Bit2, Bit0, Bit1, Bit0. For a higher word length of the second portion, this scheme could be continued accordingly with providing the next more significant bit.

The leftmost input of the AND-gates A2, A3, A5 and A9 is coupled to a connection VDD for providing a logical 1. The leftmost inputs of the remaining AND-gates are coupled to the output of a respective OR-gate on its left hand side which receives a more significant bit of the input bits Bit0 to Bit3 compared to their input bits. For example, AND-gates A6 and A7 are coupled to the output of the OR-gate O5, wherein the AND-gate A5 receives the bit Bit2 which has more significance than the bits Bit0, Bit1 received by the AND-gates A6, A7.

By the set of OR-gates O1 to O16, it can be achieved that if one stage, corresponding to one of the control signals, is selected, all of the stages on the respective left hand side, that means all stages comprising a lower significance, generate a logical 1 at their respective outputs. In this embodiment, the decoder logic can be reset when receiving a new binary value at the input 33. This can be done by providing a logical 0 at the strobe input STR. After resetting the decoder logic, a logical 1 is provided at the strobe input STR, making a switching of the AND-gates A1 to A16 possible.

Figure 5:
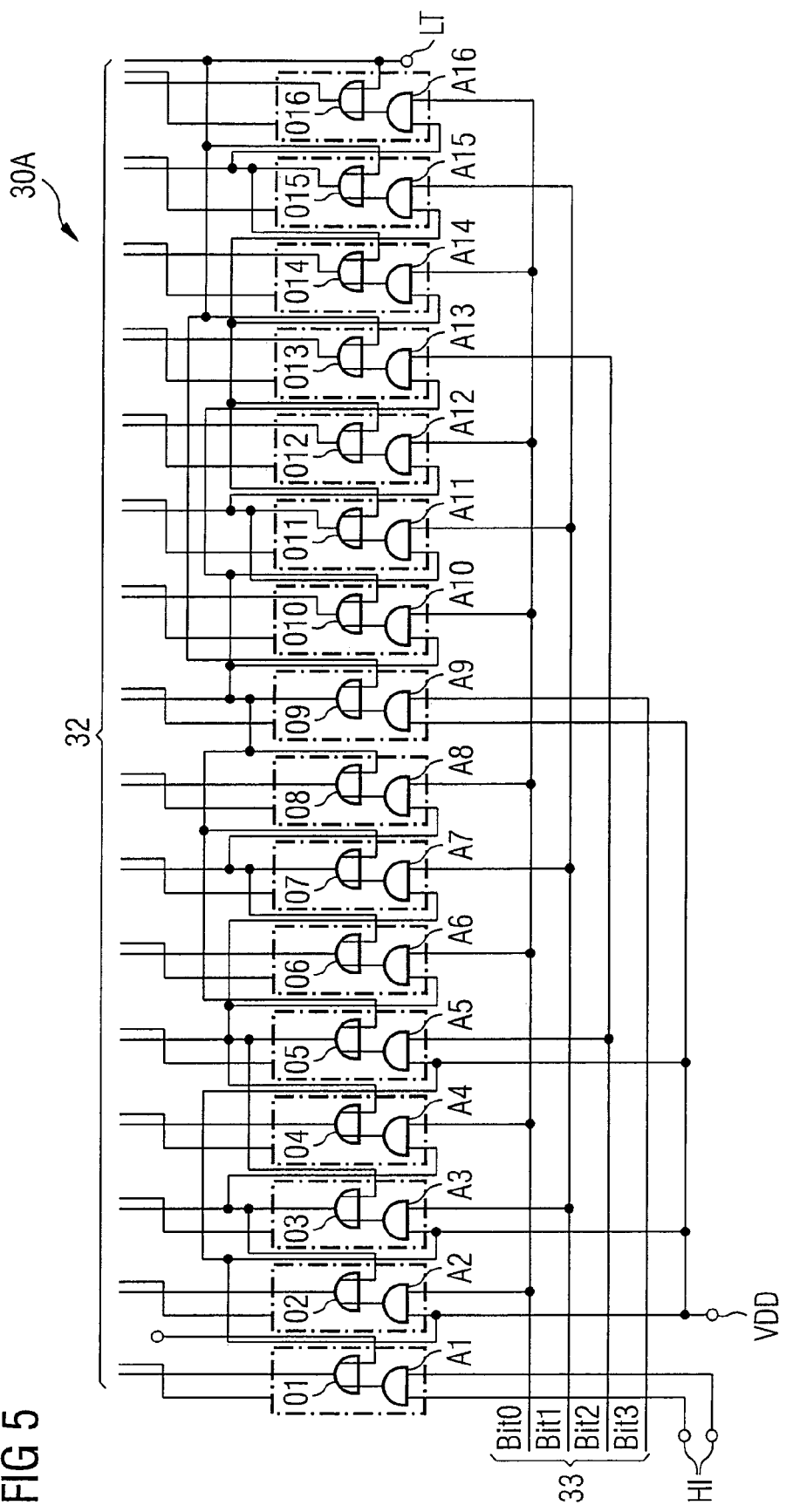
FIG. 5 is a second embodiment of a decoder unit.

FIG. 5 shows another embodiment of a decoder logic 30a. Compared to the embodiment shown in FIG. 4, the decoder logic of FIG. 5 does not comprise a strobe input STR such that the AND-gates A2 to A16 are coupled to the control input 33 with a first input and to a supply voltage tap VDD or to an output of an OR-gate corresponding to a less significant control signal, similar to the embodiment shown in FIG. 4.

The first input of the OR-gates O1 to O16 is coupled to an output of the respective AND-gate A1 to A16. The second input of each of the OR-gates is coupled to the output of that OR-gate on its respective right hand side which is controlled by a bit Bit0 to Bit3 having a higher significance than the bit which controls the OR-gate with the second input to be coupled to. This is independent of how much more significant the respective bit is. For example, the second input of the OR-gate O4 is coupled to the output of the OR-gate O5, and the second input of the OR-gate O5, which is controlled depending on Bit2, is coupled to the output of the OR-gate O9, which is controlled depending on Bit3.

Each of the blocks comprising one AND-gate and one OR-gate comprises a second output for providing a further control signal corresponding to the control signal at the output of the respective OR-gate. For example, the respective further control signal can be used to control a switchable current source such that its output is coupled to a second connection of a differential current output.

Figure 6:
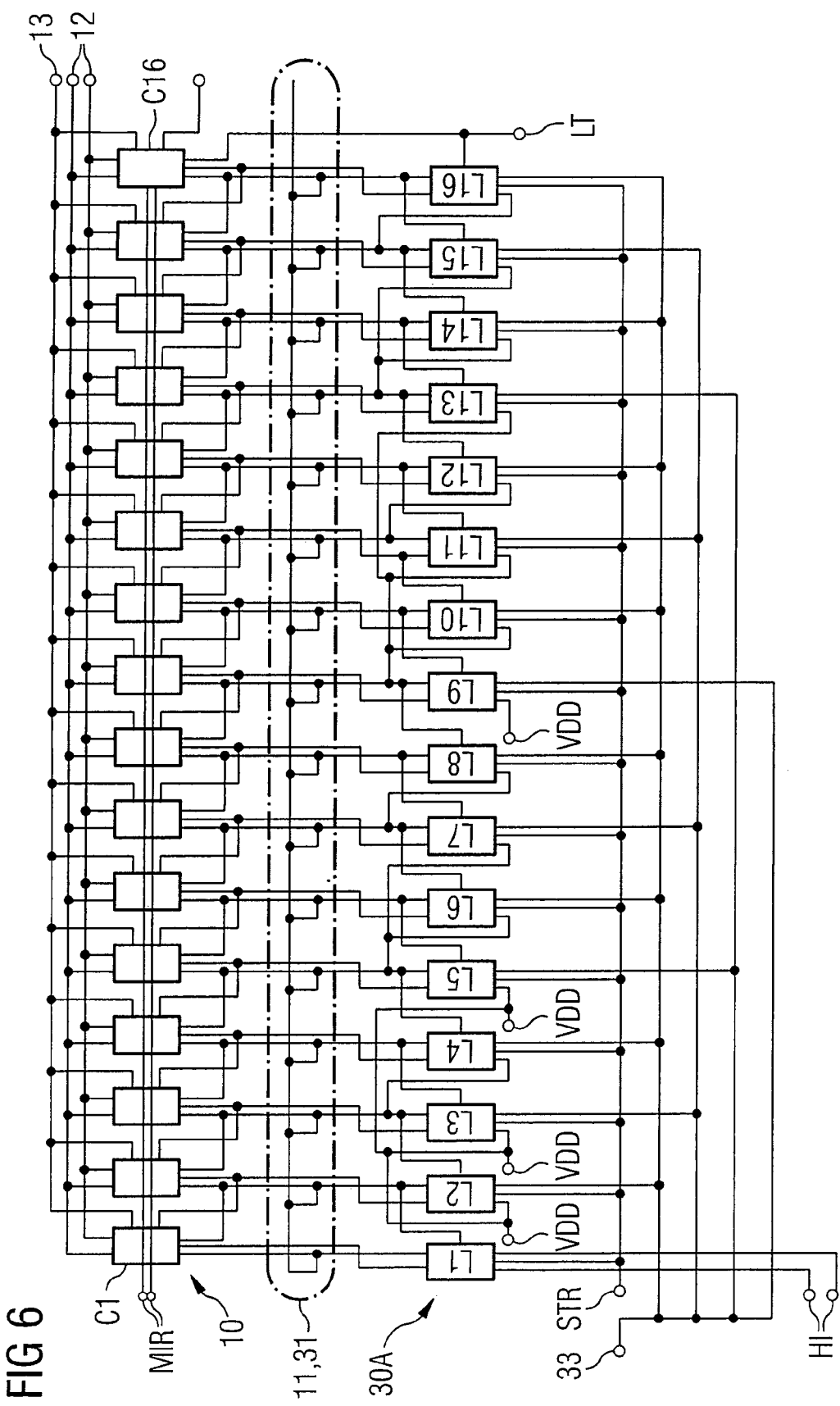
FIG. 6 is an embodiment of a first detail of a programmable current generator.

FIG. 6 shows an embodiment of a detail of a decoder logic 30a and a first array of current sources 10. In this embodiment, the decoder logic 30a comprises logical blocks L1 to L16 which, for example, each comprise one of the AND-gates A1 to A16 and one of the OR-gates O1 to O16, respectively. Each of the current sources C1 to C16 of the first array 10 of current sources comprises a differential output which is coupled to the first output 12. The current sources C1 to C16 also comprise a second output coupled to the auxiliary output 13. Each of the current sources C1 to C16 is coupled to a current mirror input MIR to receive, for example, control voltages of respective transistors and/or cascode transistors of the switchable current sources. The current sources C1 to C16 are coupled to the logical blocks L1 to L16 via the first control input/output 11, 31 for receiving the control signals that determine to which of the outputs 12, 13 an output current of the current sources is provided to. The switching can be performed by a switching logic comprised by each of the current sources C1 to C16.

Figure 7:
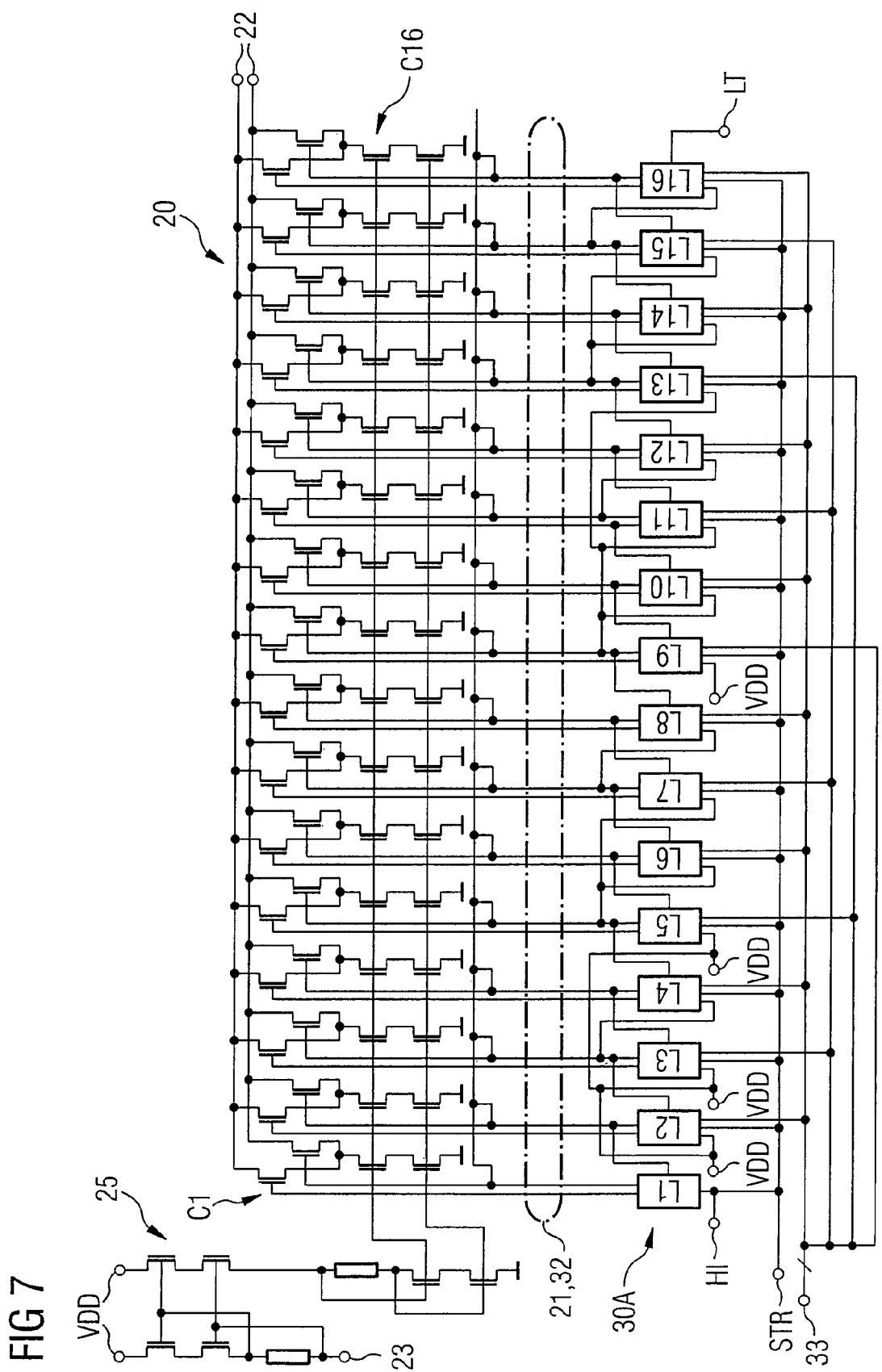
FIG. 7 is an embodiment of a second detail of a programmable current generator.

FIG. 7 shows an embodiment of a detail of a decoder logic 30a and a second array 20 of current sources. Similar to the embodiment shown in FIG. 3, the second array 20 comprises a dual stage current mirror 25 which comprises a first and a second cascode current mirror. Each of the current sources C1 to C16 comprises a first and a second transistor which are coupled to the current mirror 25 for adjusting an output current of the respective current sources C1 to C16. Furthermore, each of the current sources C1 to C16 comprises a first and a second switching transistor which are coupled to respective logic elements L1 to L16 of the decoder logic 30a via the second control input/output 21, 32. Depending on the second set of control signals provided by the decoder logic 30a, the output currents of the current sources C1 to C16 are provided to one of the connections of the differential output 22.

In another embodiment a logical zero is provided at the input HI. In this case no offset current is provided at the output 22 for a binary value of zero at the input 33. As the current source C1 does not provide any current for any binary value at the input 33, the current source C1 could also be omitted, together with the respective logic element L1. Nevertheless, the output current IOUT increases for an increasing binary value of the current control word CCW monotonically also in this embodiment. FIG. 8 shows an exemplary schematic overview of a current generation in the first and the second array 10, 20 of current sources. In this embodiment, the current generator further comprises a current mixer coupled to the first and the second output 12, 22 and to the current output 3. A reference current IREF is provided to the reference current input 14 of the first array 10 of current sources. The first array 10 comprises the current mirror 15 which in this embodiment performs a scaling of the reference current IREF by a scaling factor of 1/16. In this embodiment, the current control word CCW comprises 12 bits as a non-limiting example of which eight more significant bits form the first portion and four less significant bits form the second portion of the current control word CCW. This results in a first set of $2^8$=256 control signals and the respective number of current sources within the first array 10 which are not shown in their full number for a better overview in this embodiment.

By means of the control signals provided by the current mirror 15, each of the switchable current sources of the first array 10 is able to provide a partial current with a current value corresponding to IREF/16 to the first output 12 depending on the first set MSB of control signals. As one of the current sources of the first array 10 provides its output current as the auxiliary current IB to the second array 20, the first current IMSB can be 255 times the current value of one of the current sources of the first array 10.

The auxiliary current IB is scaled by the current mirror 25 by a factor of ½ such that each of the 16 ($2^4$) switchable current sources of the second array 20 can provide a partial current with a value corresponding to IREF/32. The second current ILSB at the output 22 of the second array 20 can be formed by the sum of 16 times the partial current of one of the current sources of the second array 20. Again, not all of the 16 current sources are shown in FIG. 8 for ease of illustration.

In one embodiment the current mixer 40 which is provided with the first and the second current IMSB, ILSB generates the output current IOUT by combining and weighting the first and the second current IMSB, ILSB at the first and the second output 12, 22. To this end, it is desirable that the current mixer scales down the second current ILSB such that the maximum value of the second current ILSB corresponds to a partial current of one of the switchable current sources of the first array 10. To this end, the first current IMSB is scaled by a factor of x/16 and the second current ILSB is scaled by a factor of x/128 in the current mixer 40 before summing the currents up to the output current IOUT, wherein x is a scaling factor between the reference current IREF and a weighted value of the output current IOUT.

FIG. 9 shows another embodiment of a programmable current generator, receiving a 12 bit current control word CCW comprising a more significant portion of 8 bits and a less significant portion of 4 bits. In this embodiment, the current mirror 25 is provided with an additional current IA1 at its input side such that control voltages of the transistors of the current mirror 25 are at a voltage level that is higher than a threshold voltage of the used transistors. The same additional current IA1 is drawn from the output of the current mirror 25 which is provided to the switchable current sources of the second array 20 is the same as it would be without adding and subtracting the additional current IA1. A scaling of the auxiliary current IB is performed within the switchable current sources with a scaling factor of ½.

In a similar way, an additional current IA2 is provided to the current mixer 40 for scaling the second current ILSB, wherein the additional current IA2 is scaled with the same scaling factor of 20/128 as the second current ILSB before subtracting it from the scaled second current. Accordingly, a third additional current IA3 is used for scaling the first current IMSB with a scaling factor of 20/16. Again, the scaled additional current IA3 is subtracted from the scaled output current of the current mixer 40. Therefore, in this embodiment, the output current IOUT can have a current value corresponding to 20 times the reference current IREF. With respect to the embodiment of FIG. 8, x would be x=20 in this case.

Figure 10:
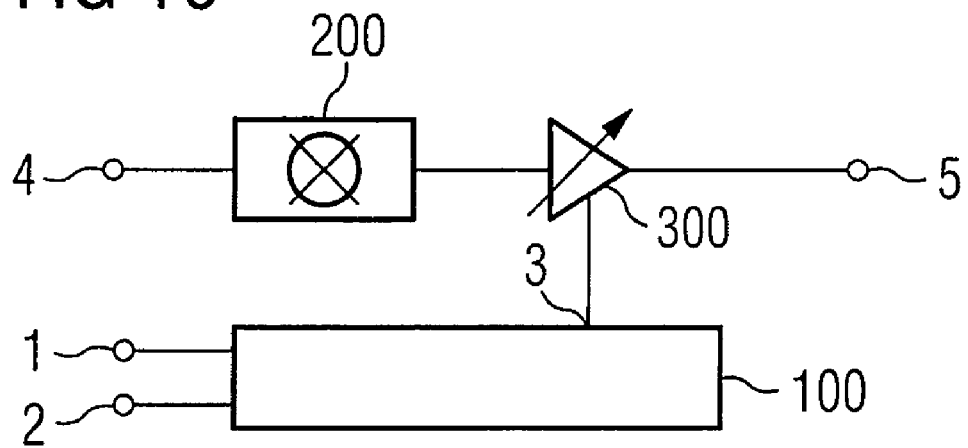
FIG. 10 is an embodiment of a transmitter arrangement.

FIG. 10 shows an embodiment of a transmitter arrangement comprising a modulation unit 200 which can be used to generate a radio frequency signal as a function of input data to be modulated which are provided at a data input 4. The modulation unit 200 can, for example, comprise a baseband unit to generate modulation data and a vector or polar modulator to generate a modulated radio frequency signal depending on the modulation data. The transmitter arrangement further comprises a power amplifier 300 which can be used to amplify the radio frequency signal provided by the modulation unit. The power amplifier 300 comprises a current input which is coupled to the current output 3 of a programmable current generator 100.

In one embodiment the programmable current generator 100 can comprise a first and a second array of current sources which can be controlled by first and second set of control signals, respectively. The first and the second set of control signals can be derived from a first and a second portion of a current control word, wherein the first array generates a first current and an auxiliary current depending on a first set of control signals and on a reference current provided at the input 2. The second array can generate a second current depending on a second set of control signals and on the auxiliary current provided by the first array. For the programmable current generator 100, also one of the embodiments shown above can be used.

Therefore, the power amplifier amplifies the radio frequency signal depending on a current derived from the first and the second current. In one embodiment, the modulation unit can generate the radio frequency signal according to a mobile radio standard, for example the Universal Mobile Telecommunication Standard.

Figure 11:
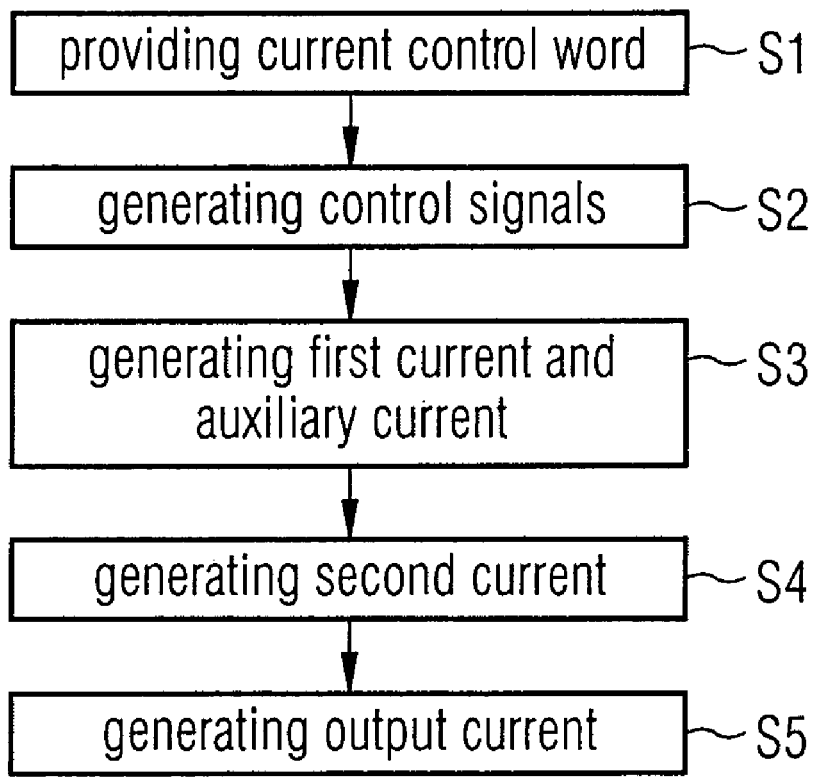
FIG. 11 is a flow chart illustrating an embodiment of a current generation method.

FIG. 11 shows an embodiment of a current generation method. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

At S1, a binary current control word CCW is provided which corresponds to a desired output current to be generated.

At S2, a first and a second set MSB, LSB of control signals are generated as a function of the current control word CCW. In one embodiment, the first set MSB of control signals is generated as a function of a first portion of the current control word CCW and a second set LSB of control signals is generated as a function of a second portion of the current control word CCW. Thereby, a respective number of the control signals of the first and the second set MSB, LSB can be a function of a word length of the first and the second portion of the current control word CCW, respectively. Furthermore, the first portion can represent a respective number of more significant bits of the current control word CCW and the second portion can represent a respective number of less significant bits of the current control word CCW.

At S3, a first current IMSB and an auxiliary current IB are generated depending on the first set MSB of control signals and on a reference current IREF. For example, the first current IMSB is generated as a sum of a number of equally weighted first partial currents depending on the first set MSB of control signals. Generating the first current IMSB and the auxiliary current IB can comprise a scaling of the reference current IREF.

At S4, a second current ILSB is generated depending on the second set LSB of control signals and on the auxiliary current IB. In one embodiment, the second current ILSB is generated as the sum of a number of equally weighted second partial currents depending on the second set LSB of control signals. Generating the second current ILSB can comprise a scaling of the auxiliary current IB.

In another embodiment, a first number of control signals of the first set MSB comprise a first logic level and the remaining control signals of the first set MSB comprise a second logic level. Accordingly, a second number of control signals of the second set LSB comprise a first logic level and the remaining control signals of the second set LSB comprise the second logic level. The first and the second set MSB, LSB of control signals can be generated as sets of thermometer coded control signals, respectively.

At S5, an output current IOUT is generated depending on the first and the second current IMSB, ILSB. For example, generating the output current IOUT comprises combining and weighting the first and the second current IMSB, ILSB.

In one embodiment, the first current and the second current IMSB, ILSB are provided as differential currents comprising a first and a second component, respectively. Accordingly, also the output current IOUT is generated as a differential current in this case.

In the embodiments described above no further logic elements than the decoder logic of the decoder unit are needed compared to a conventional current generator. Furthermore, the embodiments shown need significantly less space within an integrated circuit, especially for a word length of the current control word CCW, compared to a conventional thermometer-coded current DAC.

Because the currents of the current sources of the first array 10 are processed by the second array 20, it is not necessary that the current sources of the first array 10 have an exact matching, that means, provide exactly the same output currents. For example, it is sufficient, if the current sources of the second array 20 have a good matching.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A programmable current generator, comprising:
   a decoder unit configured to generate a first set of control signals as a function of a first portion of a current control word and to generate a second set of control signals as a function of a second portion of the current control word;
   a first array of current sources switchable as a function of the first set of control signals, the first array providing a first current and an auxiliary current, each dependent on the first set of control signals and on a reference current;
   a second array of current sources switchable as a function of the second set of control signals, wherein the second array of current sources comprises current mirrors configured to mirror the auxiliary current from the first array of current sources, and the second array providing a second current dependent on the second set of control signals and on the auxiliary current;
   a current mixer configured to scale the first current by a first non-unity factor to provide a first scaled current, and configured to scale the second current by a second non-unity factor to provide a second scaled current; and
   a current output to provide an output current based on the first scaled current and the second scaled current.

2. The current generator of claim 1, wherein a respective number of the control signals of the first and the second set is a function of a word length of the first and the second portion of the current control word, respectively.

3. The current generator of claim 1, wherein the first array of current sources each are equally weighted and the second array of current sources each are equally weighted, respectively.

4. The current generator of claim 1, wherein a first number of control signals of the first set comprise a first logic level and the remaining control signals of the first set comprise a second logic level, and wherein a second number of control signals of the second set comprise the first logic level and the remaining control signals of the second set comprise the second logic level.

5. The current generator of claim 1, wherein the first portion represents a respective number of more significant bits of the current control word and the second portion represents a respective number of less significant bits of the current control word.

6. The current generator of claim 1, wherein the first current and the second current are provided as differential currents comprising a first and a second component, respectively.

7. The current generator of claim 1, wherein the decoder unit generates the first and the second set of control signals as sets of thermometer-coded control signals, respectively.

8. The current generator of claim 7, wherein the decoder unit comprises, for each of the control signals, an AND-gate, which is provided with one of the bits of the current control word respectively, and an OR-gate providing the respective control signal, the OR-gate being coupled to an output of the respective AND-gate and to an output of another OR-gate associated with a more significant control signal or to an additional logic tap.

9. The current generator of claim 1, wherein the first current and the auxiliary current are functions of output currents of the current sources of the first array of current sources, and wherein the second current is a function of output currents of the current sources of the second array of current sources.

10. The current generator of claim 1, wherein the first array of current sources comprises at least one current mirror configured to scale the reference current.

11. The current generator of claim 1, wherein the second array of current sources comprises an additional set of current mirrors configured to scale the auxiliary current received from the first array of current sources and adjust output currents of the respective other current mirrors of the second array of current sources with respect to a scaled auxiliary current.

12. A programmable current generator, comprising:
   a decoder unit comprising a decoder logic which is coupled to a control input configured to receive a current control word, and to a first and a second set of control outputs;
   a first array comprising a set of control inputs coupled to the first set of control outputs, a reference current input, a first output, an auxiliary output and a plurality of switchable current sources, wherein each of the current sources are coupled to the reference current input and to one of the control inputs of the first array, and wherein an output of the current sources of the first array are selectively coupled to the first output or to the auxiliary output, respectively;
   a second array comprising a set of control inputs coupled to the second set of control outputs, an auxiliary input coupled to the auxiliary output, a second output and a plurality of switchable current sources that are current mirrors, wherein each of the current sources are coupled to the auxiliary input by a common input and to one of the control inputs of the second array, and wherein an output of the current sources of the second array are coupled to the second output;
   a current mixer coupled to the first and second outputs and having a current mixer output, wherein the current mixer is configured to scale a first current from the first output by a first non-unity factor to provide a first scaled current, and is further configured to scale a second current from the second output by a second non-unity factor to provide a second scaled current; and
   an output coupled to the current mixer output and configured to generate an output current based on the first scaled current and the second scaled current.

13. The current generator of claim 12, wherein a respective number of the control outputs of the first and the second set is a function of a word length of a first and a second portion of the current control word, respectively.

14. The current generator of claim 12, wherein the current sources of the first array are each equally weighted and the current sources of the second array are each equally weighted.

15. The current generator of claim 12, wherein currents at the first and the second output are provided as differential currents comprising a first and a second component, respectively.

16. The current generator of claim 12, wherein the decoder unit comprises for each of the control outputs an AND-gate, which is provided with one of the bits of the current control word respectively, and an OR-gate which on its output side is coupled to a respective control output and on its input side is coupled to an output of the respective AND-gate and to an output of another OR-gate associated with a more significant control output or to an additional logic tap.

17. The current generator of claim 12, wherein the first array comprises at least one current mirror coupled to the reference current input.

18. The current generator of claim 12, wherein the second array comprises another set of current mirrors coupled to the auxiliary current input and configured to scale the auxiliary current input and adjust the output current of the respective current sources with respect to a scaled auxiliary current input.

19. A current generation method, comprising:
providing a current control word;
generating a first and a second set of control signals as a function of the current control word;
generating a first current and an auxiliary current based on the first set of control signals and on a reference current;
generating a second current based on the second set of control signals and on mirroring the auxiliary current;
scaling the first current by a first non-unity factor to provide a first scaled current
scaling the second current by a second non-unity factor to provide a second scaled current; and
generating an output current based on the first scaled current and the second scaled current.

20. The method of claim 19, wherein the first set of control signals is generated as a function of a first portion of the current control word and the second set of control signals is generated as a function of a second portion of the current control word.

21. The method of claim 20, wherein a respective number of the control signals of the first and the second set of control signals is a function of a word length of the first portion and the second portion of the current control word respectively.

22. The method of claim 20, wherein the first portion represents a respective number of more significant bits of the current control word and the second portion represents a respective number of less significant bits of the current control word.

23. The method of claim 19, wherein the first current is generated as a sum of a number of equally weighted first partial currents based on the first set of control signals and the second current is generated as a sum of a number of equally weighted second partial currents based on the second set of control signals.

24. The method of claim 19, wherein a first number of control signals of the first set comprise a first logic level, and the remaining control signals of the first set comprise a second logic level, and wherein a second number of control signals of the second set comprise the first logic level, and the remaining control signals of the second set comprise the second logic level.

25. The method of claim 19, wherein the first current and the second current comprise differential currents comprising a first and a second component respectively.

26. The method of claim 19, wherein the first and the second set of control signals are generated as sets of thermometer-coded control signals, respectively.

27. The method of claim 19, wherein generating the first current and the auxiliary current comprises scaling the reference current.

28. The method of claim 19, wherein generating the second current comprises scaling the auxiliary current.

29. A transmitter arrangement, comprising:
a modulation unit configured to generate a radio frequency signal as a function of input data to be modulated;
a programmable current generator comprising a first and a second array of current sources that are controlled by a first and a second set of control signals, respectively, wherein the first and the second set of control signals are derived from a first and a second portion of a current control word, the first array generating a first current and an auxiliary current based on the first set of control signals and on a reference current, and the second array generating a second current based on the second set of control signals and on a mirrored auxiliary current;
a current mixer configured to scale the first and second currents by first and second non-unity factors, respectively, and thereby provide first and second scaled currents, respectively; and further configured to generate an output current by combining the first and second scaled currents; and
a power amplifier configured to amplify the radio frequency signal based on a current derived from the output current.

* * * * *